United States Patent
Thewes

(10) Patent No.: US 9,478,275 B2
(45) Date of Patent: Oct. 25, 2016

(54) REFERENCE CIRCUIT TO COMPENSATE FOR PVT VARIATIONS IN SINGLE-ENDED SENSE AMPLIFIERS

(71) Applicant: Soitec, Crolles Cedex (FR)

(72) Inventor: Roland Thewes, Puchheim (DE)

(73) Assignee: SOITEC, Bernin (FR)

( * ) Notice: Subject to any disclaimer, the term of this patent is extended or adjusted under 35 U.S.C. 154(b) by 4 days.

(21) Appl. No.: 14/434,579

(22) PCT Filed: Oct. 10, 2013

(86) PCT No.: PCT/EP2013/071159
§ 371 (c)(1),
(2) Date: Apr. 9, 2015

(87) PCT Pub. No.: WO2014/057033
PCT Pub. Date: Apr. 17, 2014

(65) Prior Publication Data
US 2015/0279448 A1    Oct. 1, 2015

(30) Foreign Application Priority Data
Oct. 10, 2012  (FR) ...................... 12 59685

(51) Int. Cl.
*G11C 7/02* (2006.01)
*G11C 11/4091* (2006.01)
(Continued)

(52) U.S. Cl.
CPC ........... *G11C 11/4091* (2013.01); *G11C 5/146* (2013.01); *G11C 7/065* (2013.01)

(58) Field of Classification Search
CPC ....................................................... G11C 7/02
USPC ....................... 365/189.011–225.7
See application file for complete search history.

(56) References Cited

U.S. PATENT DOCUMENTS 6,751,118 B2 * 6/2004 Tran .................... G11C 11/5621
365/185.03
6,975,539 B2 * 12/2005 Tran .................... G11C 11/5621
365/185.2
7,035,151 B2 * 4/2006 Tran .................... G11C 11/5621
365/185.2
(Continued)

FOREIGN PATENT DOCUMENTS

EP          2365487 A2     9/2011

OTHER PUBLICATIONS

International Preliminary Report on Patentability for International Application No. PCT/EP2013/071159 dated Apr. 14, 2015, 6 pages.
(Continued)

*Primary Examiner* — Harry W Byrne
(74) *Attorney, Agent, or Firm* — TraskBritt

(57) ABSTRACT

The disclosure relates to semiconductor memory devices and related methods. A semiconductor memory device comprises: a single-ended sense amplifier circuit for reading data sensed from selected memory cells in a memory array, the sense amplifier having a first node used to feed in a reference signal, a second node coupled to a bit line, and sense transistors responsible for amplifying the content of a selected memory cell during a sense operation, a reference circuit having replica transistors of the sense transistors and further comprising a regulation network designed so that each replica transistor operates in a stable operating point, and wherein the regulation network generates a control voltage that is applied to the sense amplifier circuit.

20 Claims, 9 Drawing Sheets

(51) Int. Cl.
*G11C 5/14* (2006.01)
*G11C 7/06* (2006.01)

(56) References Cited

U.S. PATENT DOCUMENTS

| | | | |
|---|---|---|---|
| 7,139,196 B2* | 11/2006 | Tran | G11C 11/5621 365/185.2 |
| 7,330,388 B1 | 2/2008 | Chapman et al. | |
| 8,614,924 B2* | 12/2013 | Tran | G11C 11/5621 365/185.22 |
| 2008/0054262 A1 | 3/2008 | Nakaya et al. | |
| 2009/0147579 A1* | 6/2009 | Tran | G11C 11/5621 365/185.08 |
| 2011/0012672 A1 | 1/2011 | Ogawa | |
| 2011/0110170 A1* | 5/2011 | Tran | G11C 11/5621 365/189.15 |

OTHER PUBLICATIONS

International Written Opinion for International Application No. PCT/EP2013/071159 dated Nov. 13, 2013, 5 pages.
Singapore Written Opinion for Singapore Application No. 112015025320 dated Dec. 17, 2015, 11 pages.
International Search Report for International Application No. PCT/EP2013/071159 dated Nov. 13, 2013, 3 pages.

* cited by examiner

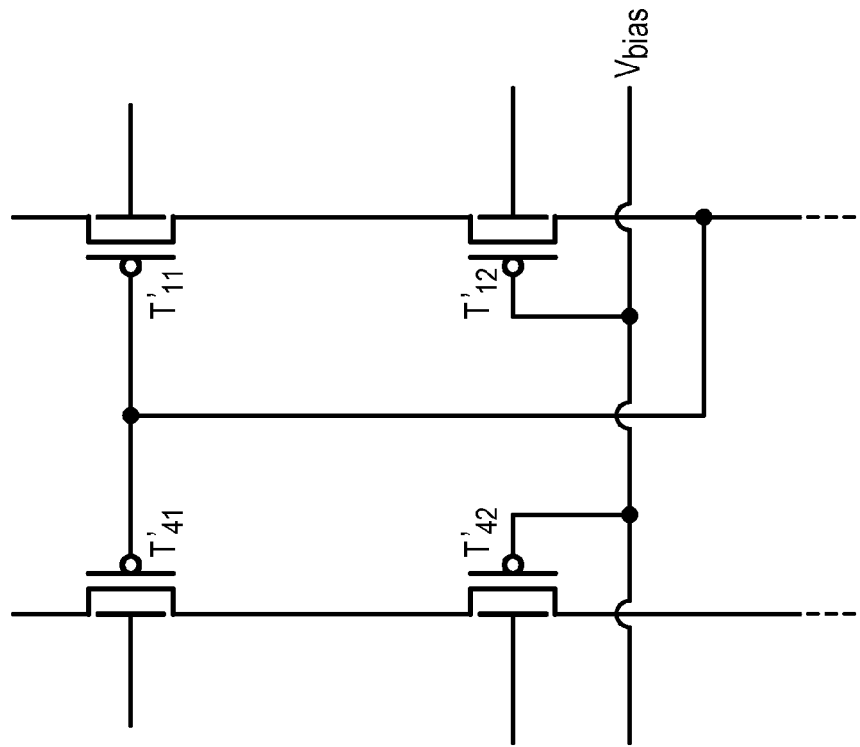
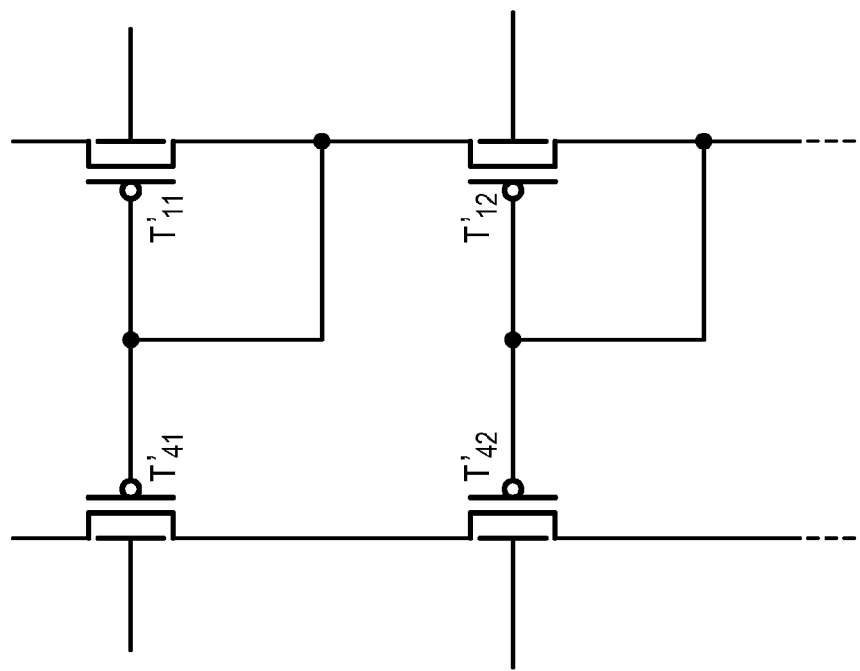

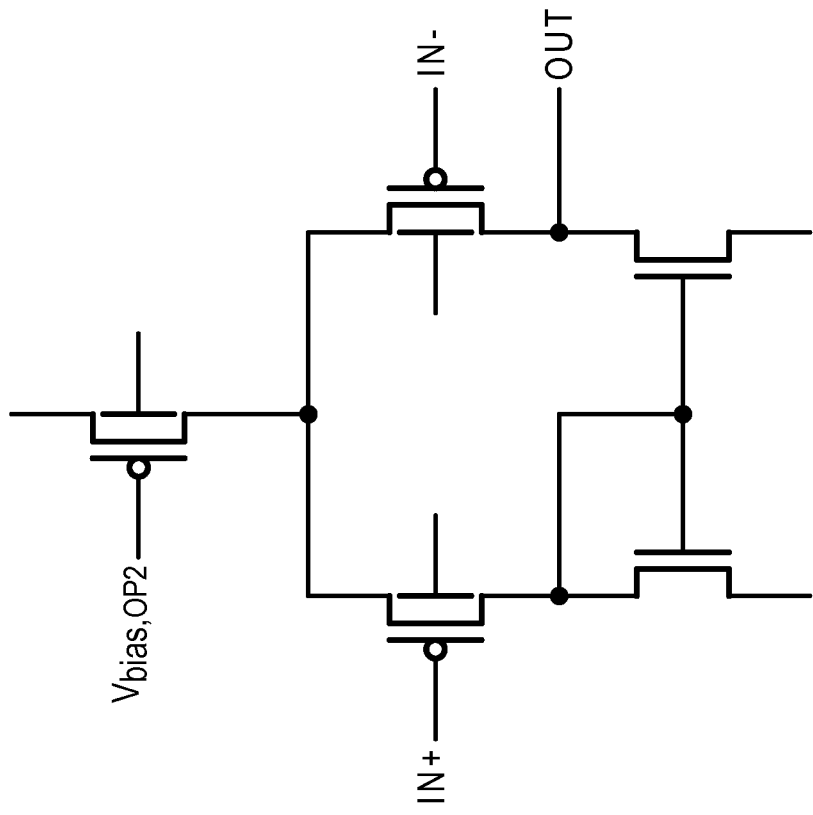
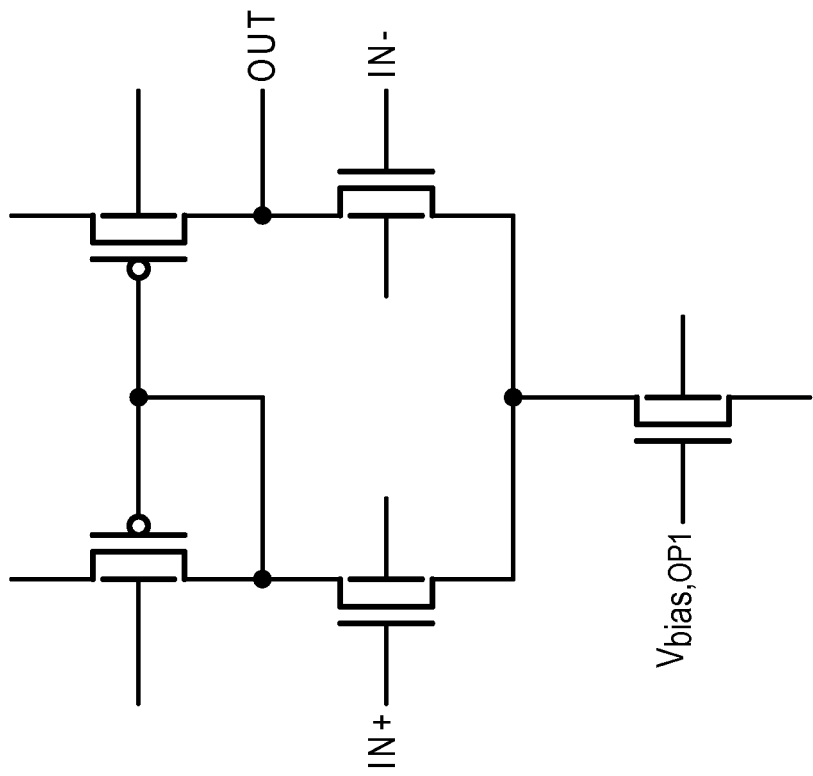

REFERENCE CIRCUIT TO COMPENSATE FOR PVT VARIATIONS IN SINGLE-ENDED SENSE AMPLIFIERS

CROSS-REFERENCE TO RELATED APPLICATIONS

This application is a national phase entry under 35 U.S.C. §371 of International Patent Application PCT/EP2013/071159, filed Oct. 10, 2013, designating the United States of America and published in English as International Patent Publication WO 2014/057033 A1 on Apr. 17, 2014, which claims the benefit under Article 8 of the Patent Cooperation Treaty and under 35 U.S.C. §119(e) to French Patent Application Serial No. 1259685, filed Oct. 10, 2012, the disclosure of each of which is hereby incorporated herein in its entirety by this reference.

TECHNICAL FIELD

The disclosure relates to a semiconductor memory device comprising a single-ended sense amplifier and, more particularly, to the provision of a reference circuit that generates a control signal to be applied to sense amplifiers in order to minimize the effects of variations in operating conditions.

BACKGROUND

Memory read operation in all kinds of sense amplifiers is achieved by comparing input data with a reference signal to determine the logic state of the input data. Conventional differential sense amplifiers are connected to two bit lines, one bit line providing the data to be read while the other bit line is used for reference voltage generation. The single-ended sense amplifier, which is coupled to a single bit line, is used in memory designs, such as in Dynamic Random-Access Memory (DRAM) designs.

A particular style of single-ended sense amplifier employs a sense amplifier with two input/output nodes, one of which is coupled to an input data line (bit line), and the other is used to feed in a reference signal for the read operation process. FIG. 1 shows an example of such a single-ended sense amplifier that has been proposed by the Applicant and previously described in publication EP 2 365 487 A2. It comprises two branches, each having a PMOS transistor and an NMOS transistor connected in series, forming cross-coupled inverters. The transistors are double gate transistors having a first control gate and a second control gate that can be independently controlled. The first branch comprises PMOS transistor T4 in series with NMOS transistor T3 in between power supplies V4 and V3, while the second branch comprises PMOS transistor T1 in series with NMOS transistor T2 in between power supplies V1 and V2. The first gates of transistors T1 and T2 are connected together (input of the inverter formed by the second branch) and to the middle node between transistors T3 and T4 (output of the inverter formed by the first branch), thereby forming a first input/output node N1 of the sense amplifier, which is used to feed in a reference signal REF. The first gates of transistors T4 and T3 are connected together (input of the inverter formed by the first branch) and to the middle node between transistors T1 and T2 (output of the inverter formed by the second branch), thereby forming a second input/output node N2 of the sense amplifier, which is coupled to a bit line BL.

A problem arises from the fact that such a circuit is not symmetrical. Indeed, both branches may have different designs concerning dimensions of the respective transistors (T1 being compared to T4, and T2 being compared to T3). Moreover, the first and second nodes N1, N2 are operated in a different manner and with different loads (with nodes N1 and N2 being either both inputs or both outputs). Moreover, the operating points of all transistors may usually differ from each other during the sensing process (once again, T1 is compared to T4, and T2 to T3). Thus, for ensuring proper operation of the circuit, widths and lengths of the transistors must be thoroughly designed (and T1 and T4, respectively, T2 and T3, may intentionally differ). Reference, bias and supply voltage must also be well defined and well controlled.

In practice, however, all these parameters and the transistor properties (current drive capability, threshold voltage, transconductance, drain conductance, etc.) are prone to variations (PVT: process, voltage, temperature). As the single-ended sense amplifier is a non-symmetrical circuit, PVT-induced variations do not compensate for each other in the two branches, and malfunction of the circuit may result.

BRIEF SUMMARY

The disclosure provides a single-ended sense amplifier that is not prone to PVT variations.

In this respect, the disclosure relates, according to its first aspect, to a semiconductor memory device comprising:
- a single-ended sense amplifier circuit for reading data sensed from selected memory cells in a memory array, the sense amplifier having a first node used to feed in a reference signal, a second node coupled to a bit line, and sense transistors responsible for amplifying the content of a selected memory cell during a sense operation,
- a reference circuit having replica transistors of the sense transistors and further comprising a regulation network designed to operate each replica transistor in a stable operating point, and wherein the regulation network generates a control voltage that is applied to the sense amplifier circuit.

Other preferred, although non-limiting, aspects of this memory device are as follows:
- the regulation network of the reference circuit is designed to set the operating point of each replica transistor equal to the operating point of the respective sense transistor at the onset of a sense operation of a selected memory cell performed by the sense amplifier circuit, the operating point at the onset of a sense operation being defined under condition that the voltage sensed on the bit line corresponds to the mean value between the voltage that would be sensed on the bit line if a logical "1" were stored within the selected memory cell and the voltage that would be sensed on the bit line if a logical "0" were stored within the selected memory cell;
- the control voltage generated by the regulation network is applied to one terminal of a replica transistor in the reference circuit and to the respective terminal of the respective sense transistor in the sense amplifier circuit;
- the sense amplifier circuit and the reference circuit each have first and second circuit branches, each of the branches having at least one first transistor of a first conductivity type and a second transistor of a second conductivity type connected in series, wherein the second transistor of each branch of the sense amplifier circuit is a sense transistor and wherein the second transistor of each branch of the reference circuit is a replica transistor of the second transistor of each branch of the sense amplifier;

the regulation network of the reference circuit comprises a first regulation loop designed to maintain the drain voltage of the replica transistor of the second branch in the reference circuit at a voltage level corresponding to the voltage level on the data line at the onset of a sense operation;

the sense transistors and the replica transistors are double gate transistors having first and second control gates, and the regulation network of the reference circuit comprises a second regulation loop designed to drive the second control gate of the replica transistor of the first branch so that the current ratio between the replica transistor of the first branch and the replica transistor of the second branch is equal to the current ratio between the sense transistor of the first branch and the sense transistor of the second branch at the onset of a sense operation;

the second regulation loop generates a control voltage that is applied to the second control gate of the replica transistor of the first branch of the reference circuit and to the second control gate of the sense transistor of the second branch of the sense amplifier circuit;

the at least one first transistor of a first conductivity type in the branches of the reference circuit are arranged so as to form a current mirror;

the replica transistors have the same lengths as the corresponding sense transistors and the same width ratio;

it has a plurality of sense amplifier circuits arranged as stripes (STSA) of sense amplifier circuits.

The disclosure further relates to a semiconductor memory incorporating a semiconductor memory device according to its first aspect, as well as to a process of operating a semiconductor memory device according to its first aspect comprising the steps of:

operating each replica transistor in a stable operating point, generating a control voltage in the reference circuit and applying the control voltage to the sense amplifier circuit.

BRIEF DESCRIPTION OF THE DRAWINGS

Other aspects, objects and advantages of the disclosure will become better apparent upon reading the following detailed description of preferred embodiments thereof, given as a non-limiting example, and made with reference to the appended drawings wherein:

FIGS. 6a and 6b show cascaded current mirrors that can be used in the semiconductor memory device of the disclosure;

FIGS. 7a, 7b and 7c show simple operational amplifiers, or basic differential stages that can be used as very simple operational amplifiers, that can be used in the semiconductor memory device of the disclosure.

DETAILED DESCRIPTION

The disclosure relates to a semiconductor memory device comprising a reference circuit and a plurality of single-ended sense amplifier circuits coupled to the reference circuit. Stated briefly, the reference circuit is designed and operated so as to generate a control signal fed to the sense amplifier circuits to compensate for all kinds of PVT variation-induced drifts and to maintain correct operation of the sense amplifier circuits independent of PVT variations.

Figure 2:
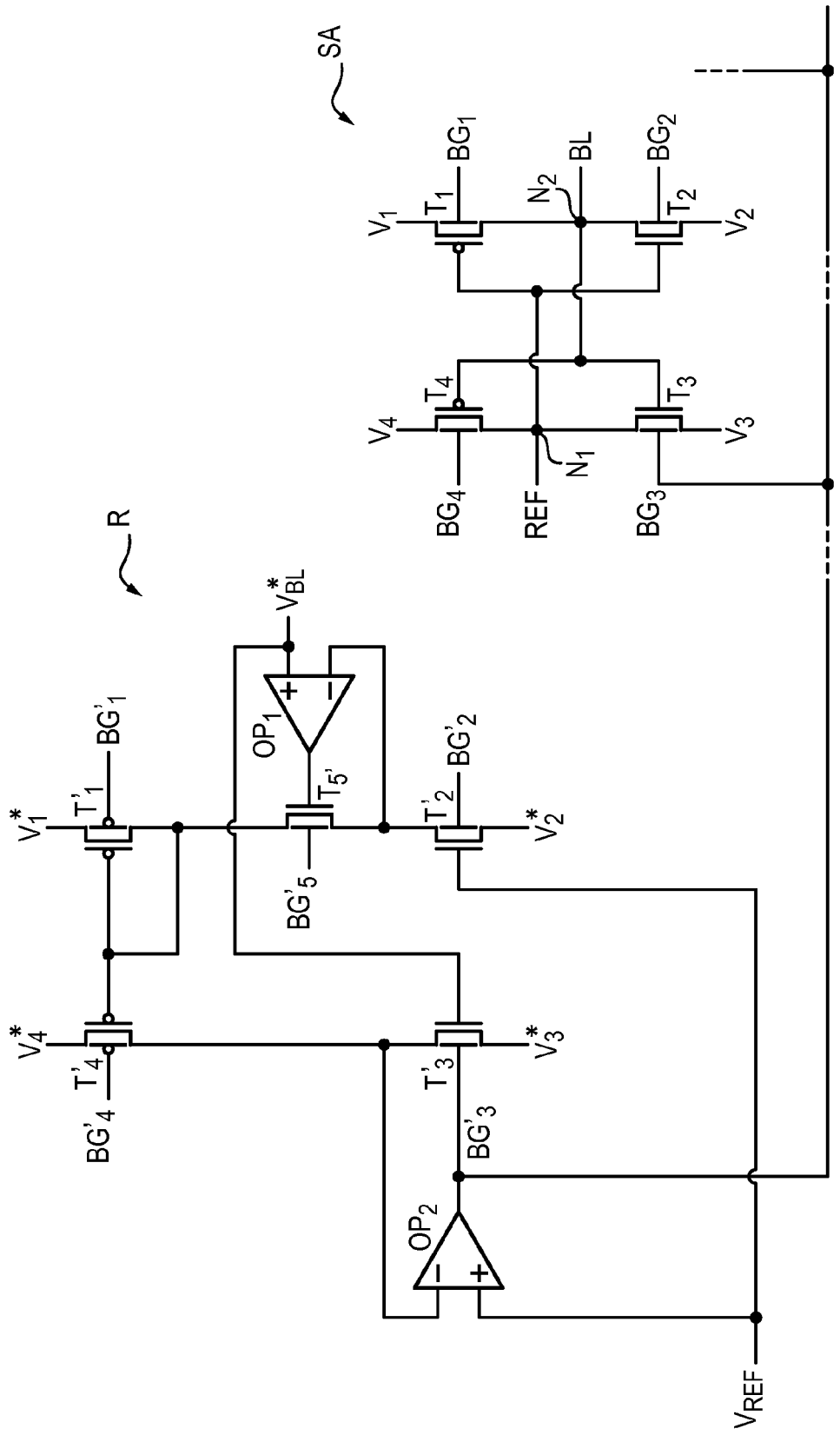
FIG. 2 shows a first embodiment of a semiconductor memory device according to the disclosure comprising a single-ended sense amplifier, together with a reference circuit for compensating the effect of PVT variations.

For ease of representation, FIG. 2 shows a single sense amplifier circuit SA coupled to the reference circuit R. However, it will be understood that the reference circuit R is coupled to a plurality of sense amplifier circuits, in an amount on the order of 1,000 sense amplifier circuits or more. The number of sense amplifiers connected to one reference circuit can be optimized depending on local gradients of PVT variations.

As for the sense amplifier circuit SA, the transistors of the reference circuit R are double gate transistors having first and second control gates than can be individually controlled.

Each double gate transistor can be a double gate transistor having a back control gate under the buried insulating layer of an SeOI substrate (Semiconductor On Insulator). The back control gate preferentially serves as the second control gate for front gate-related threshold voltage modification.

In the following description, reference will be made to front and back gates as examples of such first and second control gates of a double gate transistor. This disclosure is not limited to this specific example, and encompasses other double gate transistors, such as Fin-type double gate transistors.

Hence, it will be appreciated that the disclosure can be implemented on the following technologies: PDSOI (Partially Depleted Silicon On Insulator), FDSOI (Fully Depleted Silicon On Insulator), as well as with FinFETs and other types of double gate transistors. FDSOI proves advantageous as it allows smaller area per functionality than bulk.

Figure 1:
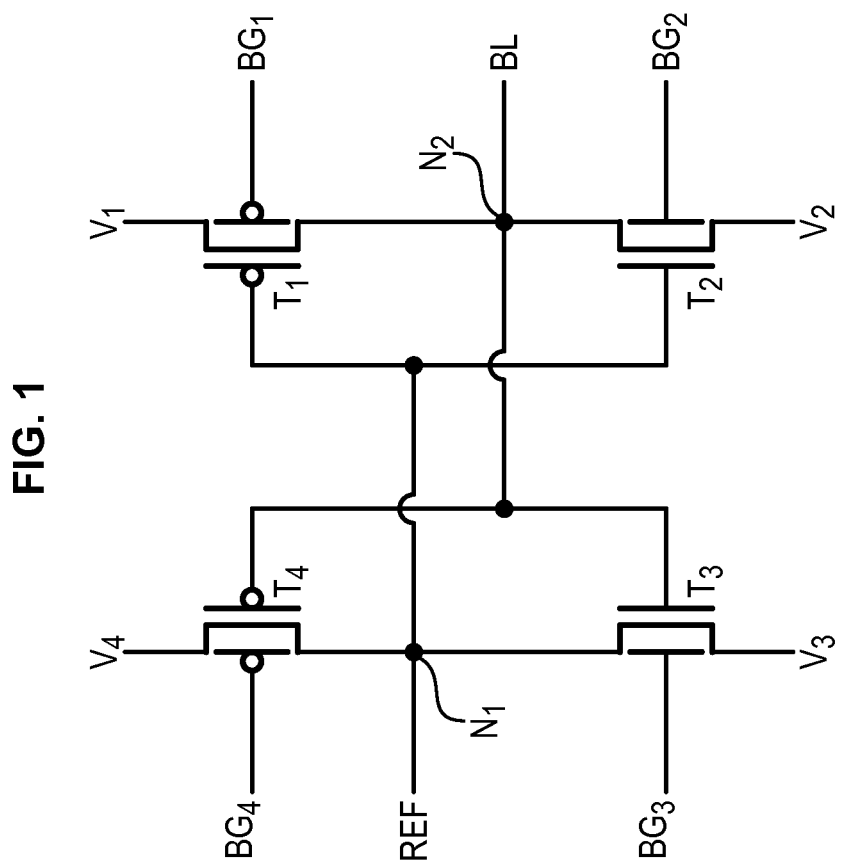
FIG. 1 shows a single-ended sense amplifier as introduced in publication EP 2 365 487 A2.

The sense amplifier circuit SA provided for reading data sensed from selected memory cells in a memory array is similar to the one of FIG. 1. In particular, it comprises two input/output nodes N1, N2 of which the first one N1 is used to feed in a reference signal REF and the second one N2 is coupled to a bit line BL. The sense amplifier circuit SA further comprises so-called sense transistors T2, T3, which are those mainly responsible for decision making during a sense operation, in particular, in that they are responsible for amplifying the content of a selected memory cell during a sense operation and digitizing the signal received from that process.

The reference circuit R is a replica of the sense amplifier circuit SA. It thus comprises two circuit branches, each of the branches having at least one first transistor T'1, T'4 of a first conductivity type and a second transistor T'2, T'3 of a second conductivity type connected in series. More particularly, the second transistor T'2, T'3 of each branch of the reference circuit R is a replica transistor of the corresponding sense transistor T2, T3 in the sense amplifier circuit SA. Preferably, the replica transistors T'2, T'3 have the same lengths as the corresponding sense transistors T2, T3 and the same width ratio (width(T'3)/width(T3)=width(r2)/width (T2)).

The reference circuit R differs from the sense amplifiers in that the first transistors T'1, T'4 in the branches of the reference circuit R are arranged so as to form a current mirror. The current mirror ensures that the current ratio in between the branches of the reference circuit R is equal to the current ratio in between the branches of the sense amplifier circuit SA at the onset of performing a sense operation, under condition that at this onset, the sensed signal is the mean value of the signal related to sensing a logical "1" and of the signal related to sensing a logical "0."

The dimensions of transistors T'1 and T'4 and the respective ratio of widths may differ from the same properties for transistors T1 and T4 because transistors T'1 and T'4 are operated in a different operating point concerning their front gate voltages. However, the choice of their widths is simple as the desired current ratio in between the branches is well known from sense amplifier circuit simulations without PVT variation-related effects. The absolute value of the current itself is well defined as the operating point of T'2 is well defined as will be explained below. An operating point of a transistor refers to the operating conditions of the transistor, especially the values of the front gate voltage and drain voltage.

The reference circuit R further differs from the sense amplifier circuit SA in that it further comprises a regulation network designed to operate each replica transistor T'2, T'3 in a stable operating point. The regulation network is more particularly designed so as to set the stable operating point of each replica transistor T'2, T'3 equal to the operating point of the respective sense transistor T2, T3 after a precharge operation at the onset of a sense operation of a memory cell performed by the sense amplifier circuit SA. In the context of the present disclosure, the "operating point at the onset of a sense operation" is defined under condition that the voltage sensed on the bit line BL at the onset of a sense operation corresponds to the mean value between the voltage that would be sensed on the bit line if a logical "1" is stored within the selected memory cell and the voltage that would be sensed on the bit line if a logical "0" is stored within the selected memory cell.

The regulation network of the reference circuit R is further designed so as to generate a control voltage that is applied to the sense amplifier circuit SA. As exemplified below, the regulation network generates a control voltage that is applied to one terminal of a replica transistor of the reference circuit R and to the respective terminal of the respective sense transistor in the sense amplifier circuits coupled to the reference circuit R.

The regulation network comprises a first regulation loop having a first operational amplifier OP1 and a regulating transistor T'5. The first operational amplifier OP1 has a non-inverting input to which is applied a reference bit line voltage $V_{BL}^*$ and which is coupled to the front gate of replica transistor T'3. The first operational amplifier OP1 further comprises an inverting input coupled to the drain of replica transistor T'2 and to the source of regulating transistor T'5. The output of the first operational amplifier OP1 is applied to the front gate of the regulating transistor T'5, which is intercalated in the series association of T'1 and T'2. The reference bit line voltage $V_{BL}^*$ corresponds to the bit line voltage after a precharge operation at the onset of performing a sense operation of the content of a memory cell; that is, the mean value between the voltage that would be sensed on the bit line if a logical "1" is stored within the sensed memory cell and the voltage that would be sensed on the bit line if a logical "0" is stored within the sensed memory cell.

This first regulation loop is thereby designed to maintain the voltage applied to the front gate of the replica transistor T'3 of the first branch and to the drain of the replica transistor T'2 of the second branch at the voltage level $V_{BL}^*$ corresponding to the voltage level on the bit line at the onset of a sense operation with a bit line voltage equal to the mean value between the bit line voltage when sensing a logical "1" and the bit line voltage when sensing a logical "0."

The regulation network comprises a second regulation loop having a second operational amplifier OP2 with a non-inverting input onto which is applied a reference voltage $V_{REF}$ and an inverting input coupled to the drain of transistor T'3. The output of the second operational amplifier OP2 is applied to the back gate of the replica transistor T'3. The reference voltage $V_{REF}$ corresponds to the voltage at the first node N1 of the sense amplifier after a precharge operation at the onset of performing a sense operation. In the embodiment of FIG. 2, the reference voltage $V_{REF}$ is directly applied to the front gate of replica transistor T'2.

This second regulation loop is thereby designed to maintain the voltage at the drain of the replica transistor T'3 of the first branch of the reference circuit R at the voltage level $V_{REF}$ corresponding to the voltage at the input node N1 of the sense amplifier circuit SA after a precharge operation at the onset of performing a sense operation. This is achieved by driving the back gate of the replica transistor T'3 of the first branch of the reference circuit R so that the current ratio between the replica transistor T'3 of the first branch of the reference circuit R and the replica transistor T'2 of the second branch of the reference circuit R is equal to the current ratio between the sense transistor T3 of the first branch of the sense amplifier circuit SA and the sense transistor T2 of the second branch of the sense amplifier circuit SA at the onset of sensing under condition that to the bit line BL is applied a voltage that corresponds to the mean value between the voltage that would be achieved on the bit line from a stored logical "1" within the cell and the voltage that would be achieved on the bit line from a stored logical "0" within the cell.

In the semiconductor memory device of the disclosure, the regulation network generates a control voltage that is applied to one terminal of a replica transistor of the reference circuit R and to the respective terminal of the respective sense transistor in the sense amplifier circuit SA. Turning back to the example embodiment of FIG. 2, the second regulation loop of the regulation network drives the back gate BG'3 of the replica transistor T'3 in the reference circuit R and the same signal is applied to the back gate BG3 of the sense transistor T3 of the sense amplifier circuit SA.

The back gates BG2' and BG2 of transistors T'2 and T2 can also be driven by the same control signal.

Hence, the regulation network maintains the reference circuit's operating point in a static manner, and at least one of the signals generated by the regulation network is used as a control signal of the sense amplifier circuit.

It will, therefore, be appreciated that the disclosure also covers a process of operating a semiconductor memory device according to the above description, comprising the steps of:

operating each replica transistor in a stable operating point,
    for instance by setting the stable operating point of each replica transistor equal to the operating point of the respective sense transistor after a precharge operation at the onset of a sense operation under condition that to the bit line BL is applied a bit line voltage equal to the mean value between the bit line voltage when sensing a logical "1" and the bit line voltage when sensing a logical "0";

generating a control voltage in the reference circuit and applying the control voltage to the sense amplifier circuit, for instance, applying the generated control voltage to one terminal of a replica transistor and to the respective terminal of the respective sense transistor.

Figure 3:
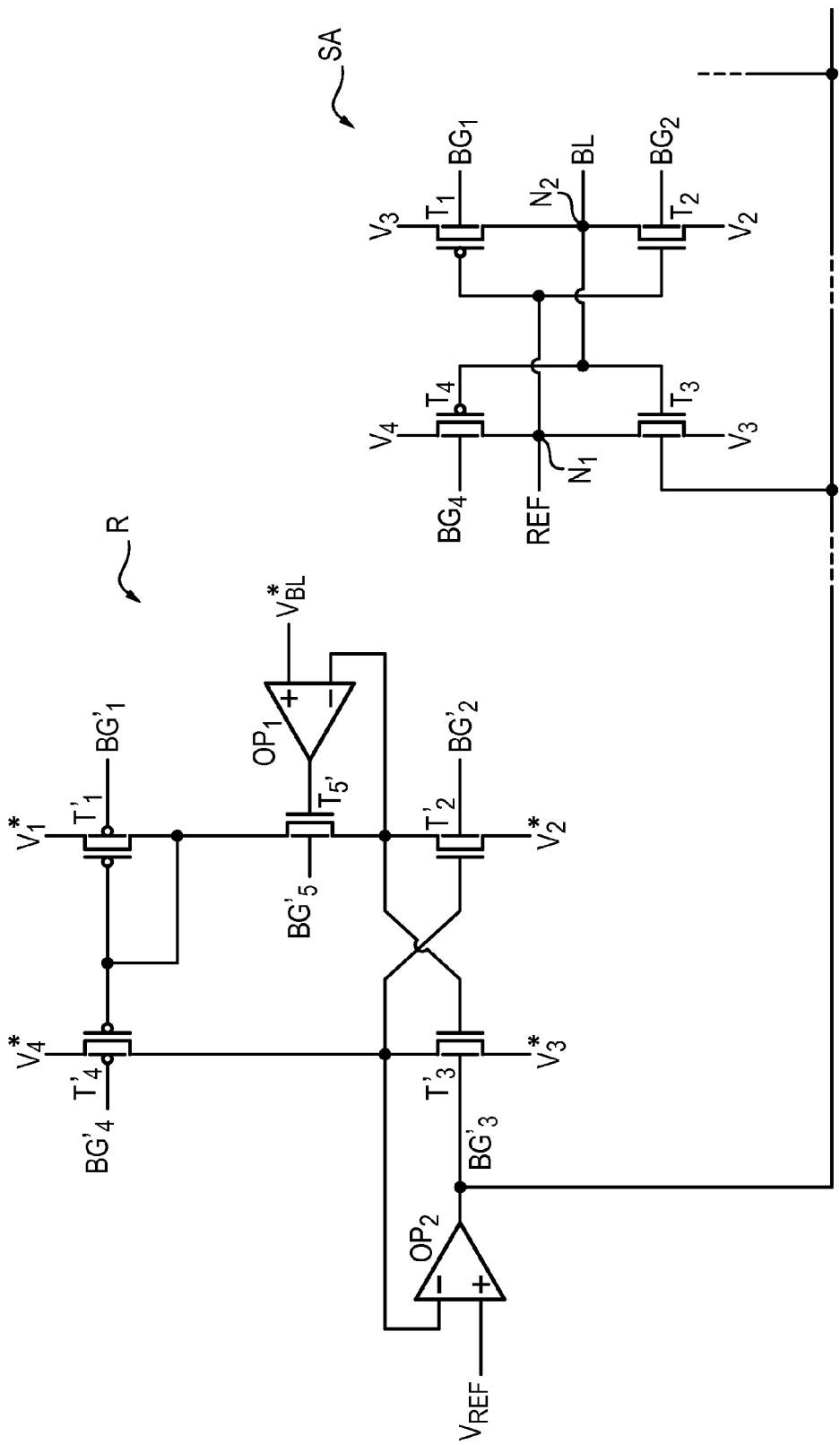
FIG. 3 shows a second embodiment of a semiconductor memory device according to the disclosure comprising a single-ended sense amplifier, together with a reference circuit for compensating the effect of PVT variations.

FIG. 3 shows another embodiment of a semiconductor memory device according to the disclosure. In the embodiment of FIG. 2, the front gates of replica transistor T'2 and T'3 are, respectively, directly controlled by the same signal as applied to the non-inverting inputs of the operational amplifiers OP1, OP2, respectively. In the embodiment of FIG. 3, these front gates are, respectively, crosswise coupled to the drain nodes of replica transistors T'2 and T'3, respectively, which also provide the input voltages applied to the inverting inputs of the operational amplifiers OP1, OP2, respectively.

Figure 4:
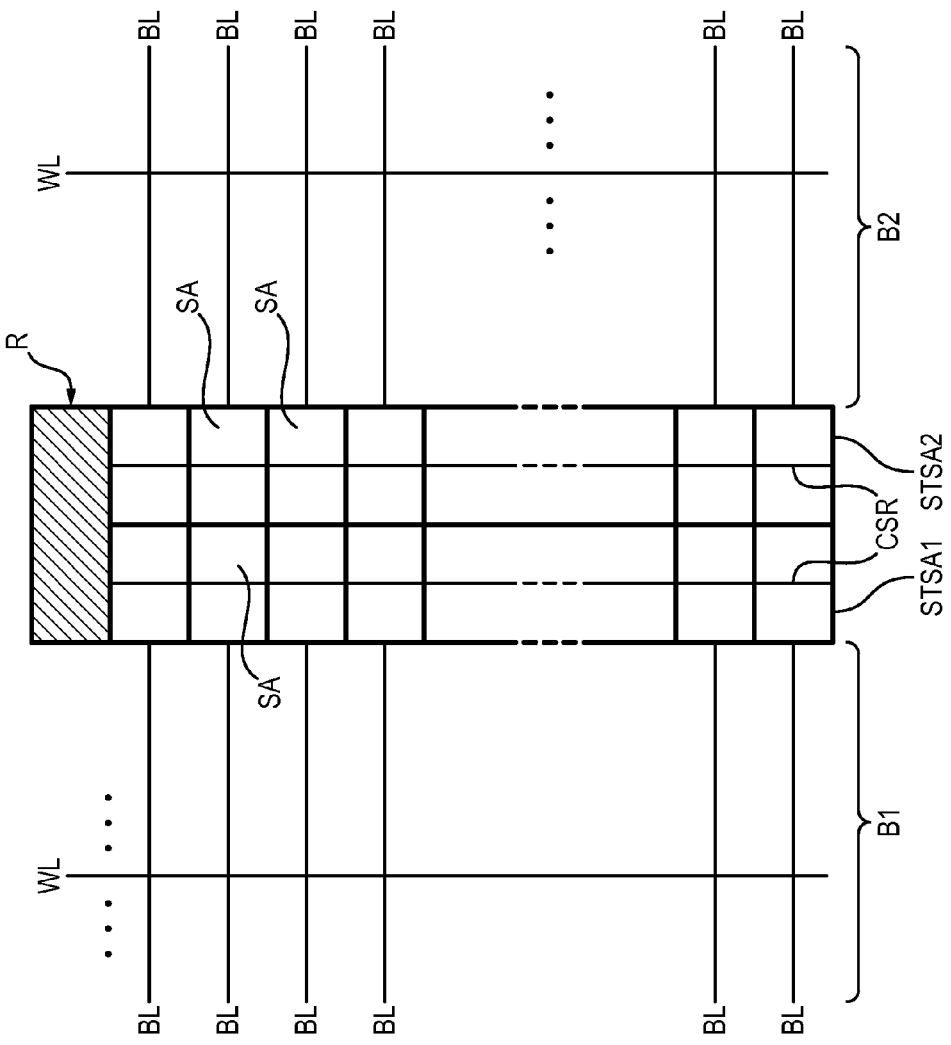
FIGS. 4 and 5 show possible layouts of a semiconductor memory device according to the disclosure comprising a single-ended sense amplifier, together with a reference circuit for compensating the effect of PVT variations.

FIG. 4 represents a semiconductor memory having memory cells arranged in an array so that individual cells can be addressed and accessed. The array can be thought of as rows and columns of cells. Each column includes a word line WL that is coupled to at least one cell in each row. Similarly, each row includes a bit line BL that is coupled to at least one cell in each column. Thus, the word and bit lines can be controlled so as to individually access each cell of the array. In FIG. 4, the memory cell array is divided into blocks B1, B2 with adjacent blocks separated by stripes STSA1, STSA2 of sense amplifier circuits SA, each strip addressing a respective block. The disclosure proposes to couple a reference circuit R to the sense amplifiers SA of the stripe by means of a control signal CSR, which corresponds to the control signal generated by the regulation network of the reference circuit. It is further proposed to arrange the reference circuit R at the top (as shown in FIG. 4) or at the bottom of the stripes. Of course, a reference circuit can be arranged at the top and at the bottom of a stripe of sense amplifier circuit, or be arranged in between the two stripes.

Figure 5:
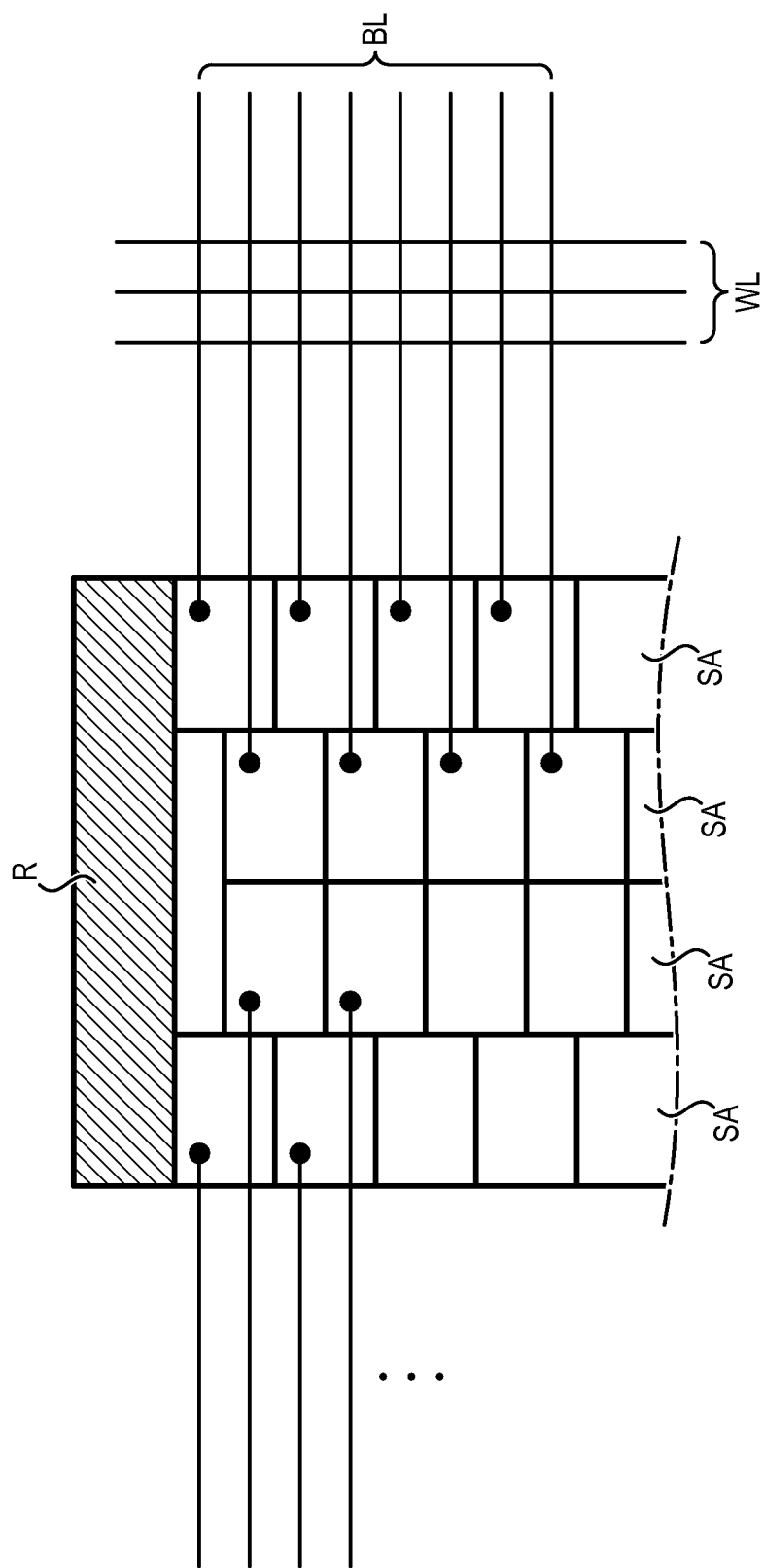

In a preferred embodiment of the disclosure represented in FIG. 5, a stacking technique, so-called "staggering," is used to take into account the pitch difference in between the sense amplifier circuits and the cells. Several sense amplifiers SA, two on FIG. 5, are, therefore, staggered one behind each other in the longitudinal direction of the bit lines.

FIGS. 6a and 6b show more advanced current mirrors that can be used in the semiconductor memory device of the disclosure in replacement of the simple current mirrors formed by transistors T'1 and T'4 in FIGS. 2 and 3. FIG. 6a shows a cascaded current mirror making use of four transistors T'11, T'12, T'41 and T'42 (two transistors per branch of the reference circuit) and capable of providing a higher degree of current ratio precision, in particular, with respect to the dependence of the current mirror output current on the applied current mirror output voltage. This cascaded current mirror can be modified so that the front gates of transistors T'41 and T'11 are coupled to the first branch of the replica circuit R rather than to the second branch of the replica circuit R, and still be used in the disclosure. FIG. 6b shows another example of a suitable low-voltage cascaded current mirror making use of an external control voltage Vbias, which is applied to the front gates of transistors T'42 and T'12, and can be adequately controlled. On both FIGS. 6a and 6b, the dotted lines illustrate that the current mirror is to be incorporated with the rest of the reference circuit (transistors T'3 and T'2, as well as the regulation network).

Figure 7C:
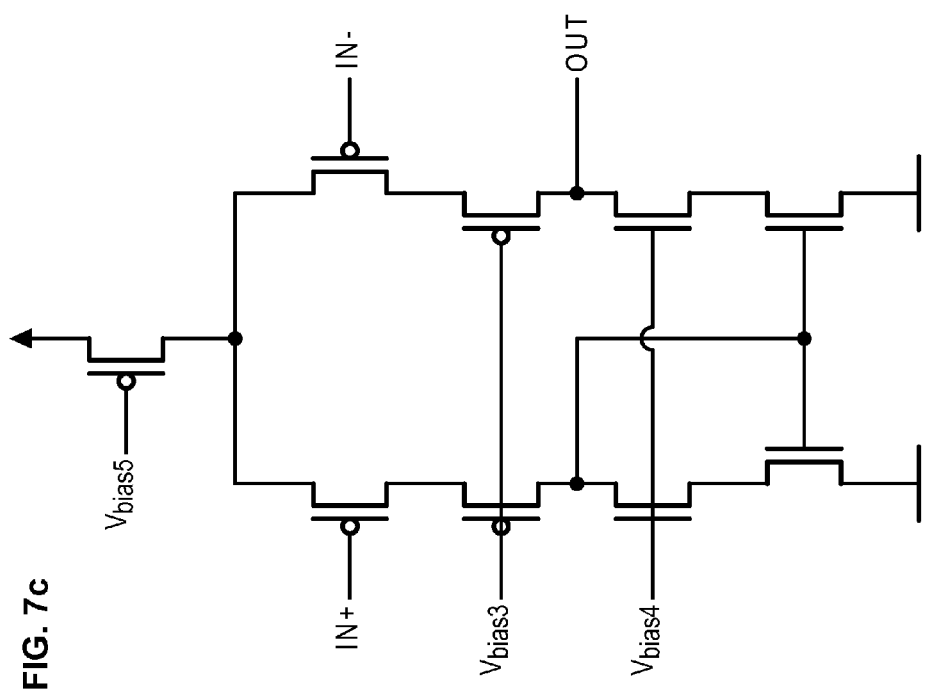

FIGS. 7a, 7b and 7c show operational amplifiers that can be used in the semiconductor memory device of the disclosure. FIGS. 7a and 7b show simple single-ended differential stages that exhibit very low complexity, low power consumption, good stability as they have a single pole at the output only, sufficiently high gain, in particular, under condition that the related transistors are operated in the moderate inversion or sub threshold region. FIG. 7c shows a telescopic operational amplifier (note that the back gates are not shown to gain in drawing clarity). This telescopic operational amplifier achieves the same properties as the ones of FIGS. 7a and 7b but with significantly higher gain.

Figure 8:
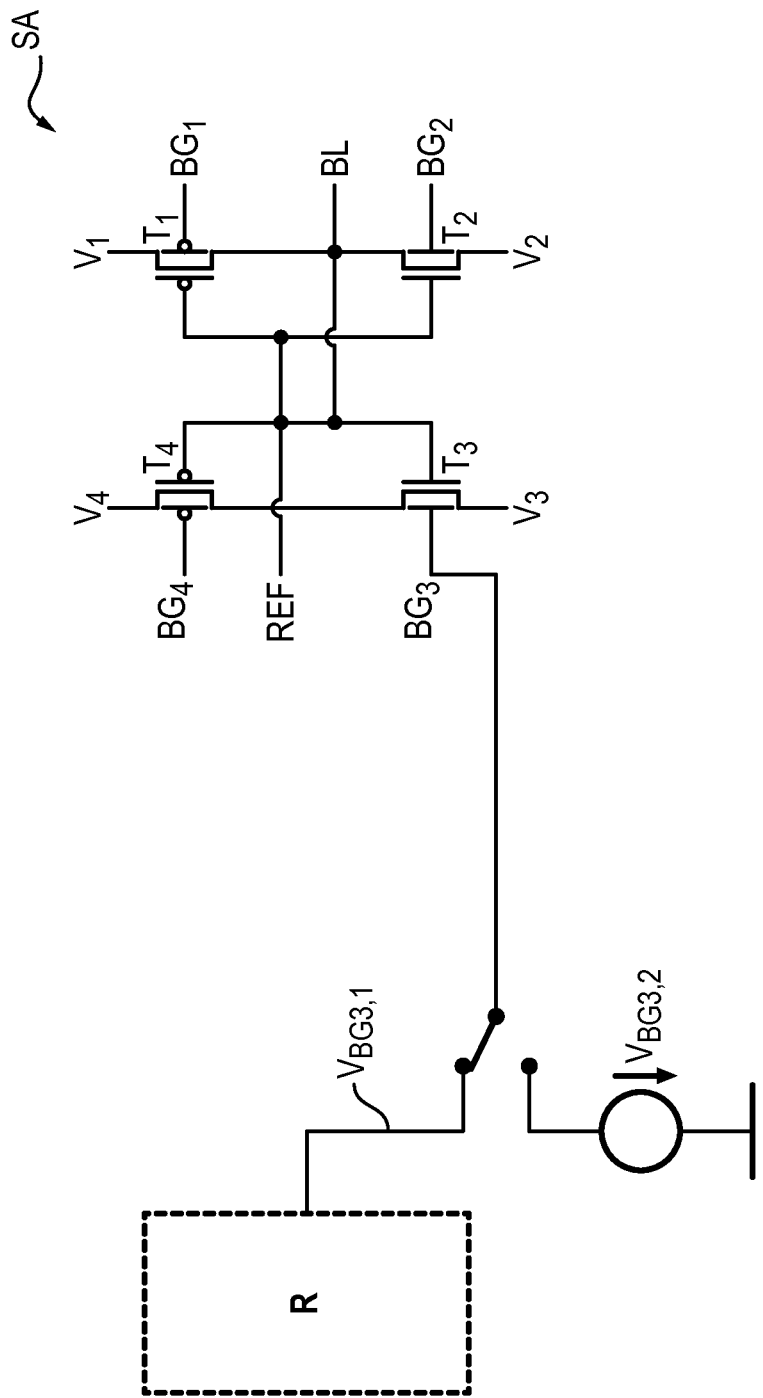
FIG. 8 shows another possible embodiment of a semiconductor memory device according to the disclosure.

Finally, it will be appreciated that the sense amplifier may be coupled to the reference circuit only for certain operations of the sense amplifier. Indeed, as described in EP 2 365 487 A2, the sense amplifier SA allows various operation modes. In some of these operation modes, at least one of the back gates of the transistors is switched between two voltages, so as to switch the transistor OFF or to switch it to an active mode. Whereas the OFF state can be easily achieved and the related back gate voltage does not need to be precisely regulated, for the active mode, a PVT-compensated voltage may be required as previously explained. FIG. 8 shows an embodiment of the disclosure according to which the back gate voltage of transistor T3 in the sense amplifier SA can be switched in between a precisely control voltage $V_{BG3,1}$, which is provided by the reference circuit R so as to compensate for PVT variations, and a fixed and unregulated voltage $V_{BG3,2}$, which is, for instance, used to switch the transistor to the OFF state. Switching from $V_{BG3,2}$ to $V_{BG3,1}$ is performed at the onset of a sense operation.

The invention claimed is:

1. A semiconductor memory device comprising:
    a single-ended sense amplifier circuit for reading data sensed from selected memory cells in a memory array, the sense amplifier having a first node used to feed in a reference signal, a second node coupled to a bit line, and sense transistors responsible for amplifying the content of a selected memory cell during a sense operation; and
    a reference circuit having replica transistors of the sense transistors and further comprising a regulation network designed so that each replica transistor operates in a stable operating point, and wherein the regulation network generates a control voltage that is applied to the sense amplifier circuit.

2. The semiconductor memory device of claim 1, wherein the regulation network of the reference circuit is designed to set the operating point of each replica transistor equal to the operating point of the respective sense transistor at the onset of a sense operation of a selected memory cell performed by the sense amplifier circuit, said operating point at the onset of a sense operation being defined under condition that the voltage sensed on the bit line corresponds to the mean value between the voltage that would be sensed on the bit line if a logical "1" were stored within the selected memory cell and the voltage that would be sensed on the bit line if a logical "0" were stored within the selected memory cell.

3. The semiconductor memory device of claim 1, wherein the control voltage generated by the regulation network is applied to one terminal of a replica transistor in the reference circuit and to the respective terminal of the respective sense transistor in the sense amplifier circuit.

4. The semiconductor memory device of claim 1, wherein the sense amplifier circuit and the reference circuit each have first and second circuit branches, each of said branches having at least one first transistor of a first conductivity type and a second transistor of a second conductivity type connected in series, wherein the second transistor of each branch of the sense amplifier circuit is a sense transistor and wherein the second transistor of each branch of the reference circuit is a replica transistor of the second transistor of each branch of the sense amplifier.

5. The semiconductor memory device of claim 4, wherein the regulation network of the reference circuit comprises a first regulation loop designed to maintain the drain voltage of the replica transistor of the second branch in the reference circuit at a voltage level corresponding to the voltage level on the data line at the onset of a sense operation under condition that the voltage sensed on the bit line at the onset of a sense operation corresponds to the mean value between the voltage that would be sensed on the bit line from a logical "1" stored within the selected memory cell and the voltage that would be sensed on the bit line from a logical "0" stored within the selected memory cell.

6. The semiconductor memory device of claim 5, wherein the sense transistors and the replica transistors are double gate transistors having first and second control gates, and wherein the regulation network of the reference circuit comprises a second regulation loop designed to drive the second control gate of the replica transistor of the first branch so that the current ratio between the replica transistor of the first branch and the replica transistor of the second branch is equal to the current ratio between the sense transistor of the first branch and the sense transistor of the second branch at the onset of a sense operation under condition that the voltage sensed on the bit line corresponds to the mean value between the voltage that would be sensed on the bit line from a logical "1" stored within the selected memory cell and the voltage that would be sensed on the bit line from a logical "0" stored within the selected memory cell.

7. The semiconductor memory device of claim 6, wherein the second regulation loop generates a control voltage that is applied to the second control gate of the replica transistor of the first branch of the reference circuit and to the second control gate of the sense transistor of the second branch of the sense amplifier circuit.

8. The semiconductor memory device of claim 4, wherein the at least one first transistors of a first conductivity type in the branches of the reference circuit are arranged so as to form a current mirror.

9. The semiconductor memory device of claim 4, wherein the replica transistors have the same lengths as the corresponding sense transistors and the same width ratio as the corresponding sense transistors.

10. The semiconductor memory device of claim 1, further comprising a plurality of single-ended sense amplifier circuits configured to receive the control voltage from the reference circuit, the plurality of single-ended sense amplifier circuits including the single-ended sense amplifier circuit, wherein the plurality of single-ended sense amplifier circuits is arranged as stripes of single-ended sense amplifier circuits.

11. The semiconductor memory device of claim 1, further comprising a plurality of single-ended sense amplifier circuits configured to receive the control voltage from the reference circuit, the plurality of single-ended sense amplifier circuits including the single-ended sense amplifier circuit, wherein the plurality of single-ended sense amplifier circuits is arranged in a staggered arrangement to take into account a pitch difference between the plurality of sense amplifier circuits and the memory cells in the memory array.

12. The semiconductor memory device of claim 1, wherein a front gate of each of the replica transistors is crosswise coupled to a drain of the other of the replica transistors.

13. A method of operating a semiconductor memory device, the method comprising:
performing a sense operation by amplifying a signal received at a first node of a single-ended sense amplifier circuit from a selected memory cell with sense transistors of the single-ended sense amplifier circuit;
maintaining replica transistors of a reference circuit in a stable operating point with a regulation network of the reference circuit; and
providing a control voltage to the single-ended sense amplifier circuit with the regulation network of the reference circuit.

14. The method of claim 13, wherein maintaining the replica transistors in a stable operating point comprises maintaining a current ratio between branches of the reference circuit equal to a current ratio between branches of the single-ended sense amplifier circuit with a current mirror of the reference circuit.

15. The method of claim 13, wherein maintaining the replica transistors in a stable operating point comprises setting the stable operating point of the replica transistors equal to an onset operating point of the sense transistors, wherein the onset operating point is an operating point of the sense transistors at the onset of the sense operation.

16. The method of claim 13, wherein providing a control voltage to the single-ended sense amplifier circuit comprises applying the control voltage to a terminal of one of the sense transistors.

17. The method of claim 16, wherein applying the control voltage to a terminal of one of the sense transistors comprises applying the control voltage to a back gate of the one of the sense transistors.

18. The method of claim 16, wherein applying the control voltage to a terminal of one of the sense transistors comprises applying the control signal to a back gate of the one of the sense transistors, and further comprising applying the control signal to a back gate of one of the replica transistors, and to a drain of the other of the replica transistors.

19. The method of claim 13, wherein maintaining the replica transistors in a stable operating point comprises maintaining, with a first regulation loop of the regulation network, a voltage potential applied to a front gate of one of the replica transistors and to a drain of the other of the replica transistors at a level equal to a mean value between a bit line voltage potential when sensing a logical "1" and the bit line voltage potential when sensing a logical "0".

20. The method of claim 13, wherein maintaining the replica transistor in a stable operating point comprises maintaining, with a second regulation loop of the regulation network, a voltage potential of a drain of one of the replica transistors at a reference voltage potential that is provided to the single-ended sense amplifier after a precharge operation at the onset of performing the sense operation.

* * * * *

UNITED STATES PATENT AND TRADEMARK OFFICE
CERTIFICATE OF CORRECTION

PATENT NO. : 9,478,275 B2
APPLICATION NO. : 14/434579
DATED : October 25, 2016
INVENTOR(S) : Roland Thewes Page 1 of 1

It is certified that error appears in the above-identified patent and that said Letters Patent is hereby corrected as shown below:

In the Specification
Column 5, Line 2, change "=width(r2)/" to --=width(T'2)/--

Signed and Sealed this
Seventh Day of March, 2017

Michelle K. Lee
*Director of the United States Patent and Trademark Office*